(12) United States Patent
Foster et al.

(10) Patent No.: US 6,372,644 B1
(45) Date of Patent: Apr. 16, 2002

(54) HYDROGEN PASSIVATED SILICON NITRIDE SPACERS FOR REDUCED NICKEL SILICIDE BRIDGING

(75) Inventors: John C. Foster; Paul L. King, both of Mountain View, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/789,765

(22) Filed: Feb. 22, 2001

(51) Int. Cl.[7] ............... H01L 21/336; H01L 21/4763; H01L 21/44
(52) U.S. Cl. ............... 438/682; 438/649; 438/651; 438/655; 438/664; 438/299
(58) Field of Search ............... 438/682, 630, 438/642, 649, 651, 655, 660, 663, 664, 683, 299, 300

(56) References Cited

U.S. PATENT DOCUMENTS 6,156,654 A * 12/2000 Ho et al. ............... 438/683
6,225,197 B1 * 5/2001 Maekawa ............... 438/487

OTHER PUBLICATIONS

Xiang et al, "Deep Sub–100nm CMOS with Ultra Low Gate Sheet Reistance by NiSi", VLSI Technology 2000, Digest of Technical Paper Symposium, Jun. 13, 2000, pp 76–77.*
Poon et al, "Thermal Stability of Nickel Silicide Films in Submicron p–type Polysilicon lines", Electronic Devices Meetings 1997, Proceeding, Aug. 30, 1997, pp 54–58.*

* cited by examiner

*Primary Examiner*—Tuan H. Nguyen
*Assistant Examiner*—Thanhha Pham

(57) ABSTRACT

Bridging between nickel silicide layers on a gate electrode and associated source/drain regions along silicon nitride sidewall spacers is prevented by hydrogen passivation of the exposed surfaces of the silicon nitride sidewall spacers. Embodiments include treating the silicon nitride sidewall spacers with a solution of HF and $H_2O$, at a HF:$H_2O$ volume ratio of about 100:1 to about 200:1 for up to about 60 seconds at room temperature. Hydrogen passivation reduces the number of silicon dangling bonds, thereby avoiding reaction with subsequently deposited nickel and, hence, avoiding the formation of a bridging film of nickel silicide on the sidewall spacers.

14 Claims, 3 Drawing Sheets

HYDROGEN PASSIVATED SILICON NITRIDE SPACERS FOR REDUCED NICKEL SILICIDE BRIDGING

TECHNICAL FIELD

The present invention relates to the fabrication of semiconductor devices, particularly to self-aligned silicide (salicide) technology. The present invention is particularly applicable to ultra large scale integrated circuit (ULSI) systems having features in the deep sub-micron regime.

BACKGROUND ART

As integrated circuit geometries continue to plunge into the deep sub-micron regime, it becomes increasingly more difficult to accurately form discreet devices on a semiconductor substrate with the requisite reliability. High performance microprocessor applications require rapid speed of semiconductor circuitry. The speed of semiconductor circuitry varies inversely with the resistance (R) and capacitance (C) of the interconnection system. The higher the value of the R×C product, the more limiting the circuit operating speed. Miniaturization requires long interconnects having small contacts and small cross-sections. Accordingly, continuing reduction in design rules into the deep sub-micron regime requires decreasing the R and C associated with interconnection paths. Thus, low resistivity interconnection paths are critical to fabricating dense, high performance devices.

A common approach to reduce the resistivity of the interconnect to less than that exhibited by polysilicon alone, e.g., less than about 15–300 ohm/sq, comprises forming a multilayer structure consisting of a low resistance material, e.g., a refractory metal silicide, on a doped polycrystalline silicon layer, typically referred to as a polycide. Advantageously, the polycide gate/interconnect structure preserves the known work function of polycrystalline silicon and the highly reliable polycrystalline silicon/silicon oxide interface, since polycrystalline silicon is directly on the gate oxide.

Various metal silicide have been employed in salicide technology, such as titanium, tungsten, and cobalt. Nickel, however, offers particularly advantages, vis-à-vis other metals in salicide technology. Nickel requires a lower thermal budget in that nickel silicide can be formed in a single heating step at a relatively low temperature of about 250° C. to about 600° C. with an attendant reduction in consumption of silicon in the substrate, thereby enabling the formation of ultra-shallow source/drain junctions.

In conventional salicide technology, sputter etching is typically conducted to remove a thin native oxide layer, e.g., about 10 Å to about 15 Å, on the silicon surfaces prior to depositing a layer of the metal on the gate electrode and on the exposed surfaces of the source/drain regions. Heating is then conducted to form the metal silicide. Unreacted metal is then removed from the dielectric sidewall spacers leaving metal silicide contacts or the upper surface of the gate electrode and on the source/drain regions. In implementing salicide technology, it was found advantageous to employ silicon nitride sidewall spacers, since silicon nitride is highly conformal and enhances device performance, particularly for p-type transistors. However, although silicon nitride spacers are advantageous from such processing standpoints, it was found extremely difficult to effect nickel silicidation of the gate electrode and source/drain regions without undesirable nickel silicide bridging therebetween along the surface of the silicon nitride sidewall spacers, thereby causing short circuiting.

Accordingly, there exists a need for salicide methodology enabling the implementation of nickel silicide interconnection systems without bridging between the nickel silicide layers on the gate electrode and the source/drain regions.

DISCLOSURE OF THE INVENTION

An advantage of the present invention is a method of manufacturing a semiconductor device having nickel silicide contacts on a gate electrode and associated source/drain regions without bridging therebetween along insulative sidewall spacers, notably silicon nitride sidewall spacers.

Additional advantages and other features of the present invention will be set forth in part in the description which follows, and in part will become apparent to those having ordinary skill in the art upon examination of the following or may be learned by practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a silicon gate electrode having opposing side surfaces on a silicon substrate with a gate insulating layer therebetween; forming silicon nitride sidewall spacers on the opposing side surfaces of the gate electrode leaving exposed adjacent surfaces of the substrate; treating the silicon nitride sidewall spacers to form hydrogen passivated surfaces; depositing a layer of nickel on the gate electrode and on the exposed substrate surfaces; and heating to react the layer of nickel with underlying silicon to form a layer of nickel silicide on the gate electrode and layers of nickel silicide on the exposed surfaces of the substrate.

Embodiments of the present invention include treating the nickel silicide spacers with a solution of hydrofluoric acid (HF) and water ($H_2O$), as at a HF:$H_2O$ volume ratio of about 100:1 to about 200:1 for up to about 60 seconds to form the hydrogen passivated surfaces, thereby substantially reducing or preventing bridging along the silicon nitride spacers.

Additional advantages of the present invention will become readily apparent to those having ordinary skill in the art from the following detailed description, wherein embodiments of the present invention are described simply by way of illustration of the best mode contemplated of carrying out the present invention. As will be realized, the present invention is capable of other and different embodiments, and its several details are capable of modifications in various obvious respects, all without departing from the present invention. Accordingly, the drawings and description are to be regarded as illutstrative in nature, and not as restrictive.

DESCRIPTION OF THE INVENTION

Figure 1:
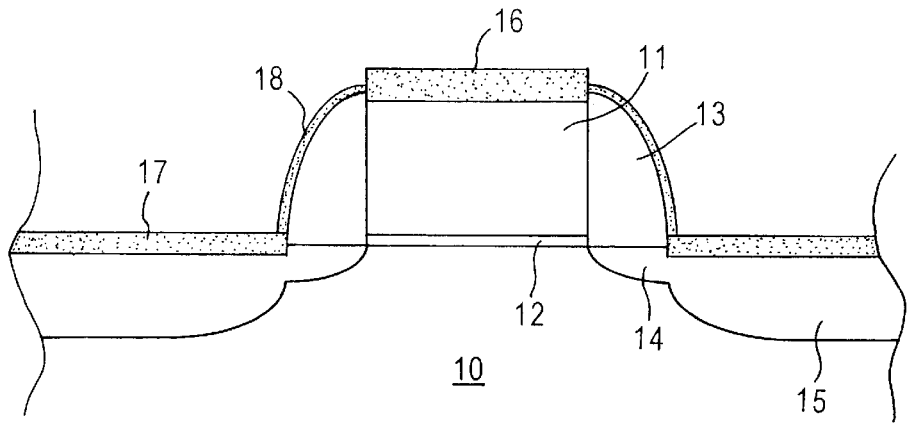
FIG. 1 schematically illustrates problematic bridging attendant upon conventional practices.
Figure 2:
FIGS. 2–5 schematically illustrate sequential phases in accordance with an embodiment of the present invention, wherein like features are denoted by like reference numerals
Figure 2:
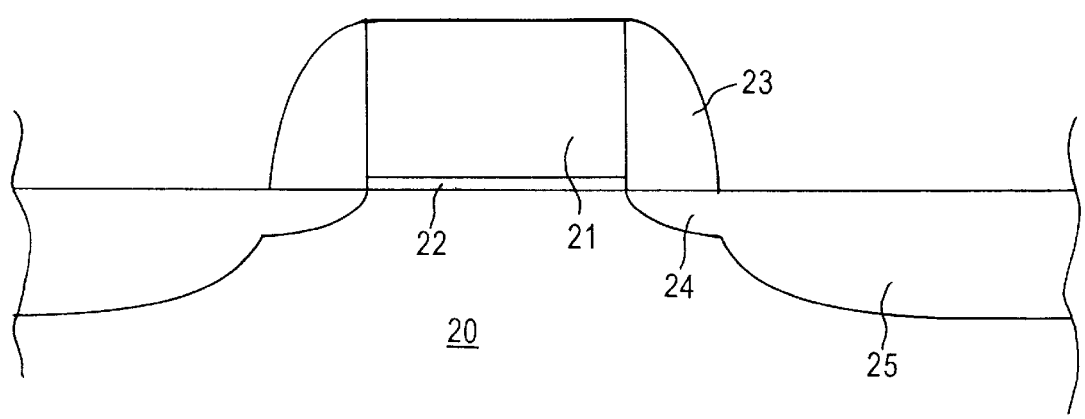

The present invention addresses and solves problems attendant upon implementing conventional salicide technology using nickel as the metal for silicidation. As device geometries shrink into the deep sub-micron regime, bridging occurs along the surface of silicon nitride sidewall spacers between the nickel silicide layer on the gate electrode and nickel silicide layers on associated source/drain regions. For example, adverting to FIG. 1, a gate electrode 11 is formed on substrate 10 with gate insulating layer 12 therebetween. Silicon nitride spacers 13 are formed on opposing side surfaces of gate electrode 11. Shallow source/drain extensions 14 and source/drain regions 15 are formed in a conventional manner. A layer of nickel is deposited followed by heating resulting in the formation of a nickel silicide layer 16 on the upper surface of gate electrode 11 and a layer of nickel silicide 17 on associated source/drain regions 15. However, it was found that nickel silicide 18 is undesirably formed along the exposed surfaces of the silicon nitride sidewall spacers 13 causing bridging and, hence, shorting between nickel silicide layer 16 and nickel silicide layers 17.

After considerable experimentation and investigation, it was postulated that the formation of nickel silicide 18 along the silicon nitride sidewall 13 stemmed from the reaction of nickel with dangling silicon bonds in the silicon nitride sidewall spacers. Upon further experimentation and investigation, it was postulated that the conventional sputter etching step conducted to remove a native oxide film of silicon oxide, typically at a thickness of about 10 Å to about 15 Å, damaged the surface of the silicon nitride spacers leaving an excessive amount of dangling silicon bonds which subsequently reacted with deposited nickel to form a thin layer of nickel silicide causing bridging between the nickel silicide layer on the upper surface of the gate electrode and the nickel silicide layers on the associated source/drain regions. The removal of the native oxide film was considered necessary in that a native oxide film was believed to be a carrier preventing silicidation of deposited metal with underlying silicon.

Upon further experimentation and investigation, it was found that the complete removal of such a native oxide layer is not necessary in the case of nickel, because of its high reactivity with silicon. Upon further investigation and experimentation, it was found that nickel silicide formation on the silicon nitride sidewall spacers can be further reduced by hydrogen passivation of the silicon nitride sidewall spacer surfaces to reduce the number of silicon dangling bonds.

In accordance with embodiments of the present invention, the surface of the silicon nitride sidewall spacers is treated with a solution of HF and $H_2O$ to form hydrogen passivated surfaces, with reduced fee silicon. In other words, treatment of the silicon nitride sidewall spacers with a solution of $HF:H_2O$ of about 100:1 to about 200:1 results in the formation of a hydrogen passivated surface region having reduced silicon with dangling bonds available for reaction with subsequently deposited nickel. Therefore, the reaction between nickel and free silicon in the silicon nitride sidewall spacers is avoided, thereby avoiding bridging.

Given the disclosed objectives and guidance of the present disclosure, the optimum conditions for hydrogen passivation of the silicon nitride sidewall spacers can be determined in a particular situation. For example, it was found suitable to treat the silicon nitride sidewall spacers with a solution of $HF:H_2O$ at a volume ratio of about 100:1 to about 200:1, e.g., about 200:1, for up to about 60 seconds at room temperature. Treatment with the $HF:H_2O$ solution can be implemented in any of various ways, as by immersion or spraying, e.g., in a conventional spray acid processor. Treatment with the $HF:H_2O$ solution does not remove the entire native oxide film on the silicon surfaces. However, it was surprisingly found that the complete removal of such a native oxide film is not necessary to successfully implement nickel silicidation. Thus, a feature of the inventive methodology comprises forming a gate electrode, forming silicon nitride sidewall spacers and depositing a layer of nickel without any intervening sputter etching technique.

An embodiment of the present invention is schematically illustrated in FIGS. 2 through 5, wherein similar reference numerals denote similar features. Adverting to FIG. 2, a gate electrode 21, e.g., doped polycrystalline silicon, is formed on silicon-containing semiconductor substrate 20, which can be n-type or p-type, with a gate insulating layer 22 therebetween. Gate insulating layer is typically silicon dioxide formed by thermal oxidation or chemical vapor deposition (CVD).

Silicon nitride sidewall spacers 23 are then formed by depositing a conformal layer and anisotropically etching. Silicon nitride sidewall spacers can be formed by CVD employing a silane flow rate of about 200 to about 400 sccm, e.g, about 375 sccm, a nitrogen flow rate of about 2,000 to about 4,000 sccm, e.g., about 2,800 sccm, an ammonia flow rate of about 2,500 to about 4,000 sccm e.g., about 3,000 sccm, a high frequency RF power of about 250 watts to about 450 watts, e.g., about 350 watts, a low frequency RF power of about 100 to about 200 watts, e.g., about 140 watts, a pressure of about 1.6 Torr. to about 2.2 Torr., e.g., about 1.9 Torr., and a temperature of about 380° C. to about 420° C., e.g., about 400° C. The silicon nitride sidewall spacers typically have a thickness of about 850 Å to about 950 Å shallow source/drain extensions 24 and moderately or heavily doped sources/drain regions 25 are formed in a conventional manner.

Figure 3:
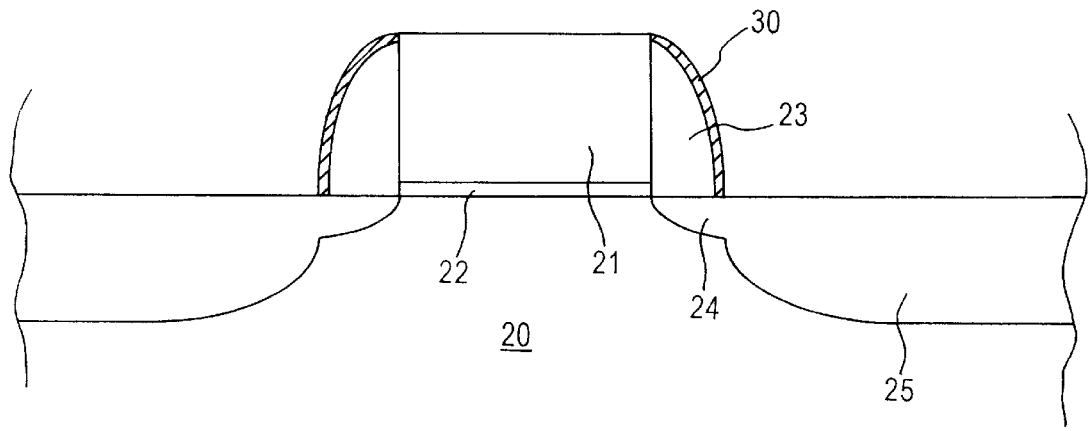

Subsequently, in accordance with embodiments of the present invention, the silicon nitride sidewall spacers 23 are treated with a $HF:H_2O$ solution, as illustrated by arrows 26. Treatment can be conducted in a conventional spray acid processor for about 60 seconds using a solution of $HF:H_2O$ at a volume ratio of about 200:1 at about room temperature. As shown in FIG. 3, treatment of the silicon nitride sidewall spacers 23 with the $HF:H_2O$ solution results in the formation of a hydrogen passivated surface region 30 with considerably reduced dangling silicon bonds. Although such treatment with $HF:H_2O$ does not completely remove a native oxide film on the silicon surfaces, nickel silidation is not prevented.

Figure 4:
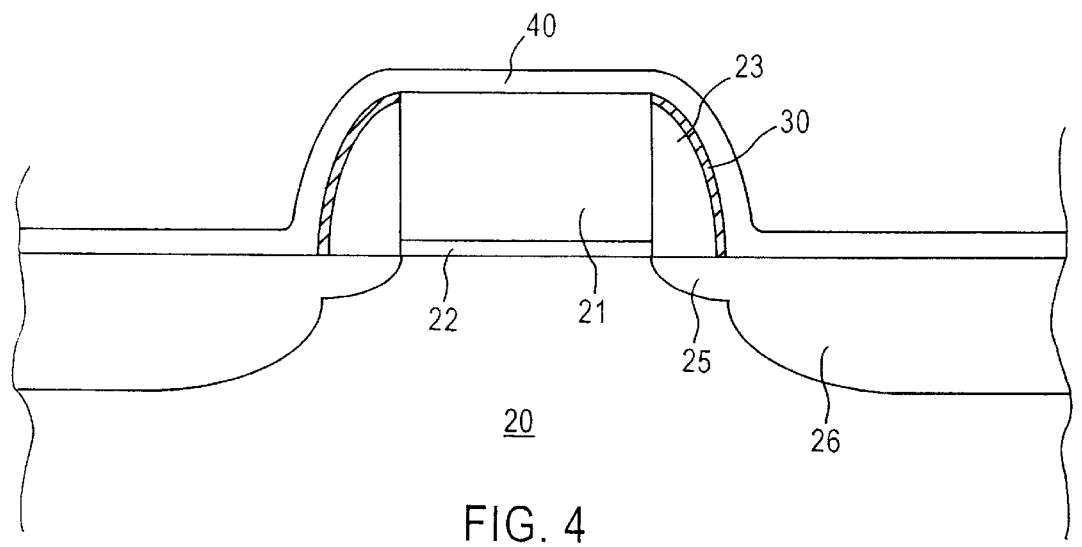
Figure 5:
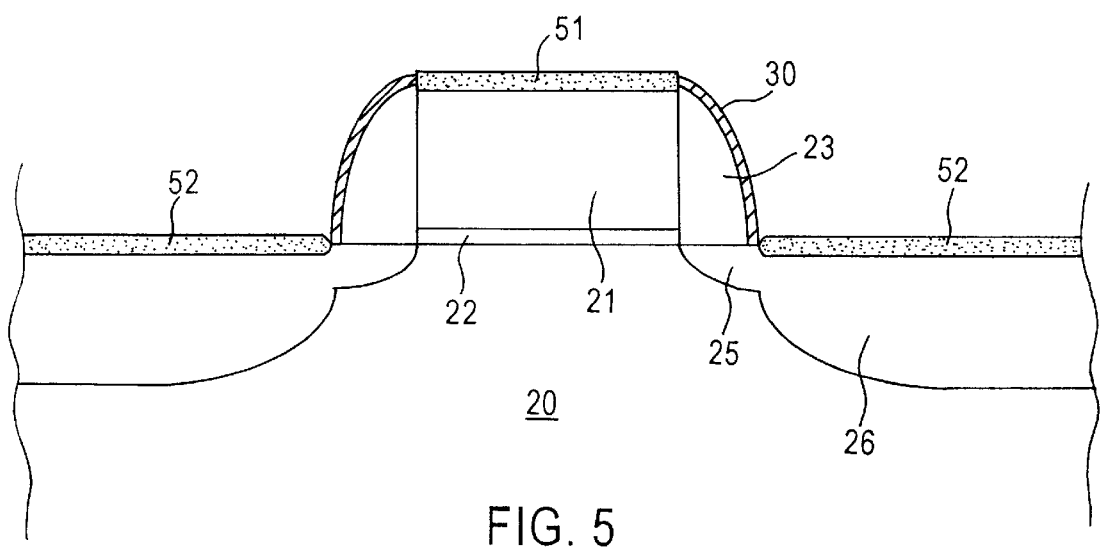

A layer of nickel 40 is then deposited as illustrated in FIG. 4. Rapid thermal annealing, as at a temperature of about 250° C. to about 600° C., e.g., about 400° C. to about 600° C., is then conducted. During such thermal treatment, nickel silicide layer 51, shown in FIG. 5, is formed on gate electrode 21 while nickel silicide layers 52 are formed on exposed portions of the substrate adjacent sidewall spacers 23. The nickel silicide layers typically have a thickness of about 200 Å to about 400 Å, e.g., about 300 Å. The formation of a hydrogen passivated surface region 30 on silicon nitride sidewall spacers 23 effectively prevents reaction of nickel layer 40 with silicon in sidewall spacers 23, thereby avoiding the formation of nickel silicide on the silicon nitride sidewall spacers 23 and, hence, preventing bridging between nickel silicide layer 51 on the upper since of gate electrode 21 and nickel silicide layers 52 on the exposed surfaces of the silicon substrate adjacent silicon nitride sidewall spacers 23. Unreacted nickel on the surfaces of the silicon nitride sidewall spacers 23 is then easily removed, as by a wet processing technique, e.g., treating with a mixture of sulfuric acid and hydrogen peroxide with a ratio of sulfuric acid: hydrogen peroxide of about 1:12 to about 1:4, e.g., about 1:2.

The present invention, therefore, enables the implementation of nickel salicide methodology, advantageously utilizing silicon nitride sidewall spacers without bridging between the nickel silicide layer formed on the upper surface of the gate electrode and the nickel silicide layers formed on associated source/drain regions. The present invention is applicable to the production of any of various types of semiconductor devices. The present invention is particularly applicable in manufacturing semiconductor devices with high circuit speeds having design features in the deep sub-micron regime.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:

forming a silicon gate electrode, having opposing side surfaces, on a silicon substrate with a gate insulating layer therebetween;

forming silicon nitride sidewall spacers on the opposing side surfaces of the gate electrode leaving exposed adjacent surfaces of the silicon substrate;

treating the silicon nitride sidewall spacers to form hydrogen passivated regions having reduced silicon with dangling bonds available for reaction with subsequently deposited nickel;

depositing a layer of nickel on the gate electrode and exposed surfaces of the silicon substrate; and heating to react the layer of nickel with underlying silicon to form a layer of nickel silicide on the gate electrode and layers of nickel silicide on the exposed surfaces of the silicon substrate, wherein the hydrogen passivated regions prevent reaction of the nickel with silicon in the silicon nitride sidewall spacers.

2. The method according to claim 1, comprising treating the silicon nitride sidewall spacers with a solution of hydrofluoric acid (HF) and water ($H_2O$) to form the hydrogen passivated regions.

3. The method according to claim 2, wherein the solution comprises FH and $H_2O$ at a volume ratio of HF:$H_2O$ of about 100:1 to about 200:1.

4. The method according to claim 3, wherein the solution has a HF:$H_2O$ volume ratio of about 200:1.

5. The method according to claim 2, comprising treating the silicon nitride sidewall spacers with the solution for a period of time up to about 60 seconds.

6. The method according to claim 2, comprising forming the silicon nitride sidewall spacers at a thickness of about 850 Å to about 950 Å.

7. The method according to claim 2, comprising forming source/drain regions in the silicon substrate proximate the opposing side surfaces of the gate electrode, wherein the nickel silicide layers on the exposed silicon substrate surfaces function as source/drain contacts.

8. The method according to claim 2, comprising depositing the layer of nickel at a thickness of about 150 Å to about 500 Å.

9. The method according to claim 2, comprising forming the gate electrode and depositing the layer of nickel without any intervening sputter etching.

10. The method according to claim 2, comprising heating at a temperature of about 400° C. to about 600° C. to form the layers of nickel silicide.

11. The method according to claim 10, comprising removing unreacted nickel from the silicon nitride sidewall spacers.

12. The method according to claim 11, comprising removing unreacted nickel from the silicon nitride sidewall spacers with a mixture comprising sulfuric acid and hydrogen peroxide.

13. The method according to claim 1, comprising forming the nickel silicide layers without complete removal of a native oxide thereunder.

14. The method according to claim 9, comprising forming the nickel silicide layers without complete removal of a native oxide thereunder.

\* \* \* \* \*